United States Patent
Delfyett et al.

(10) Patent No.: US 7,929,582 B2
(45) Date of Patent: Apr. 19, 2011

(54) SYSTEMS AND METHODS FOR GENERATING A TUNABLE LASER BEAM

(75) Inventors: Peter Delfyett, Orlando, FL (US); Jannick Rolland, Pittsford, NY (US); Panomsak Meemon, Orlando, FL (US); Kye-Sung Lee, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 92 days.

(21) Appl. No.: 12/494,713

(22) Filed: Jun. 30, 2009

(65) Prior Publication Data

US 2009/0323738 A1 Dec. 31, 2009

Related U.S. Application Data

(60) Provisional application No. 61/076,864, filed on Jun. 30, 2008.

(51) Int. Cl.
*H01S 3/10* (2006.01)
(52) U.S. Cl. ............................. 372/20; 372/19
(58) Field of Classification Search .................. 372/20, 372/29.01, 25, 28
See application file for complete search history.

(56) References Cited

U.S. PATENT DOCUMENTS

| 6,366,592 B1* | 4/2002 | Flanders | 372/18 |
|---|---|---|---|
| 2004/0071180 A1* | 4/2004 | Wang | 372/102 |
| 2004/0071181 A1* | 4/2004 | Huang | 372/106 |
| 2008/0232410 A1* | 9/2008 | Bouma et al. | 372/20 |
| 2009/0059970 A1* | 3/2009 | Atia et al. | 372/20 |

* cited by examiner

*Primary Examiner* — Minsun Harvey
*Assistant Examiner* — Tuan N. Nguyen
(74) *Attorney, Agent, or Firm* — Thomas, Kayden, Horstemeyer & Risley, LLP

(57) ABSTRACT

Systems and methods of generating a tunable laser beam are disclosed. An example method includes: generating coherent optical beams from a plurality of semiconductor optical amplifiers (SOAs); combining the coherent optical beams into a combined coherent optical beam; and tuning the combined beam to a selected frequency range to output a coherent optical beam having only the selected frequency range. In some embodiments, the SOAs are arranged in parallel within a resonant cavity, and each coherent optical beam has a different center wavelength that overlaps in bandwidth with another one of the coherent optical beams.

11 Claims, 6 Drawing Sheets

SYSTEMS AND METHODS FOR GENERATING A TUNABLE LASER BEAM

CROSS-REFERENCE TO RELATED APPLICATION

This application claims priority to copending U.S. Provisional Application Ser. No. 61/076,864 filed Jun. 30, 2008, which is hereby incorporated by reference herein in its entirety.

NOTICE OF GOVERNMENT-SPONSORED RESEARCH

This invention was made with Government support under Contract/Grant No.: FPCE and NSF/DARPA PTAP program. The Government has rights in the claimed inventions.

BACKGROUND

Wavelength tunable lasers are used in a variety of applications, such as spectroscopy, optical communication, and various medical imaging systems. The tuning range of a conventional tunable laser which uses a semiconductor optical amplifier (SOA) as its gain medium is limited to the bandwidth of the SOA. Increasing the tuning range would allow faster communication and better resolution in spectroscopy and imaging systems.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure.

DETAILED DESCRIPTION

Figure 1:
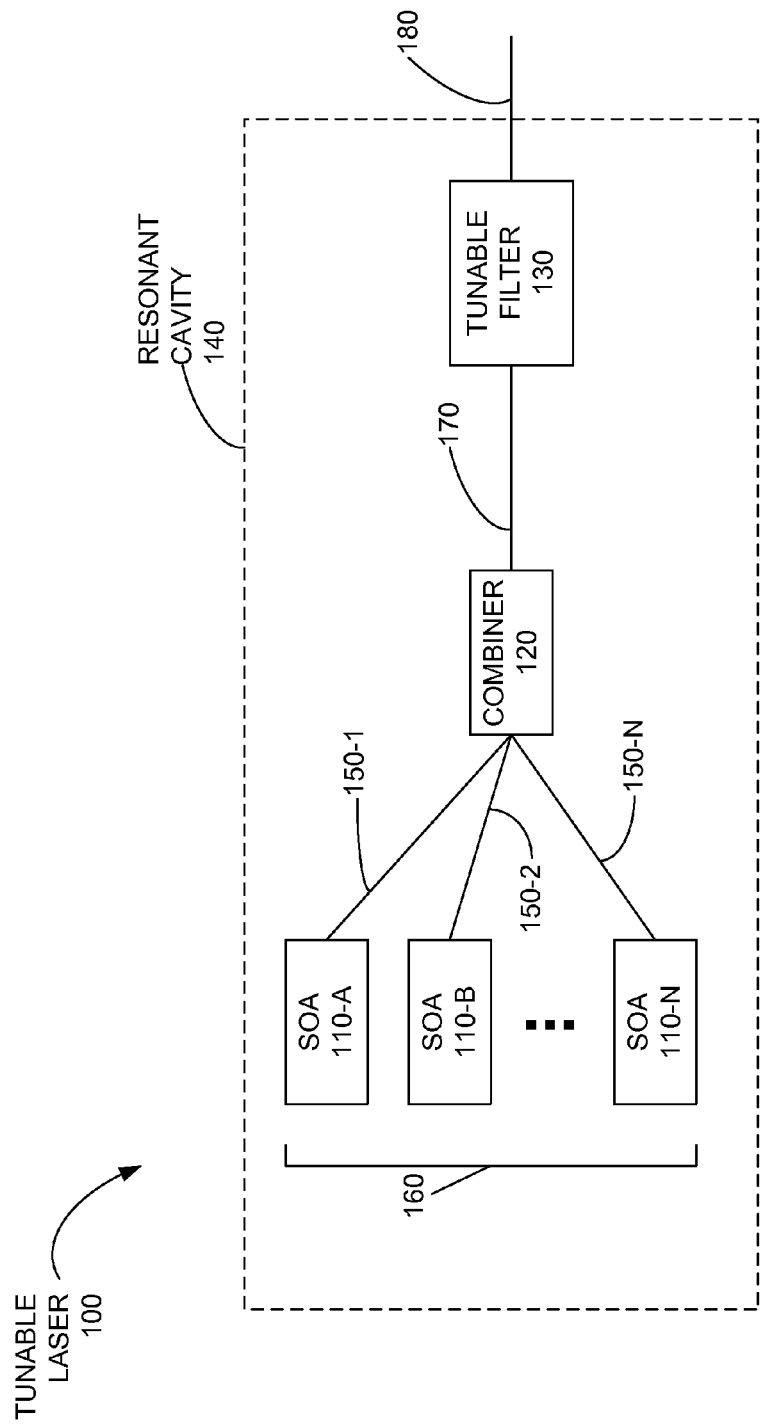
FIG. 1 is a high-level block diagram of a tunable laser in accordance with some embodiments disclosed herein.

FIG. 1 is a high-level block diagram describing systems and methods for generating a tunable laser beam in accordance with some embodiments disclosed herein. A tunable laser 100 includes multiple semiconductor optical amplifiers (SOAs) 110, an optical combiner 120, and a tunable filter 130, all residing in a resonant cavity 140. Each SOA (110-A, 110-B, 110-N) operates as a gain medium, producing a corresponding coherent optical beam (150-A, 150-B, 150-N). Persons of ordinary skill in the art should understand how the gain media and the resonator cavity interact to produce stimulated emission, i.e., to form a laser. Since FIG. 1 is a high-level diagram, such a person should also understand that various components that are unnecessary to explain the operation of tunable laser 100 are omitted (e.g. a collimating lens, output coupler mirror, etc.). Although the particular shape of resonant cavity 140 is not critical, various configurations of resonant cavity 140 are contemplated, for example, a linear cavity, a ring cavity, etc.

The coherent optical beams 150 generated by SOAs 110 have different center wavelengths that overlap in frequency bandwidth. SOAs 110 are arranged in parallel (160), and the individual coherent optical beams 150 are combined by optical combiner 120 to produce a combined optical beam 170, which is in turn provided to tunable filter 130. A control input causes tunable filter 130 to select one particular frequency range that lies within the combined frequency bandwidth. Tunable laser 100 thus outputs a tuned coherent optical beam 180 at this selected frequency.

Tunable filter 130 has a sufficient tuning range, which corresponds to the overall spectral range of the individual SOAs 110. Tunable filter 130 can take various forms, including (for example) a Fabry-Perot tunable filter or a polygon mirror scanner. In some embodiments, the laser amplification process of an SOA 110 is relatively fast so that the overall frequency sweep speed of tunable laser 100 is limited by the tuning speed of tunable filter 130.

The configuration of tunable laser 100 extends the tunable range beyond the limitations of the individual SOAs 110. The resulting broad spectral range is useful for many different applications, e.g., optical coherence tomography (OCT), spectroscopy, and optical communication.

Figure 2:
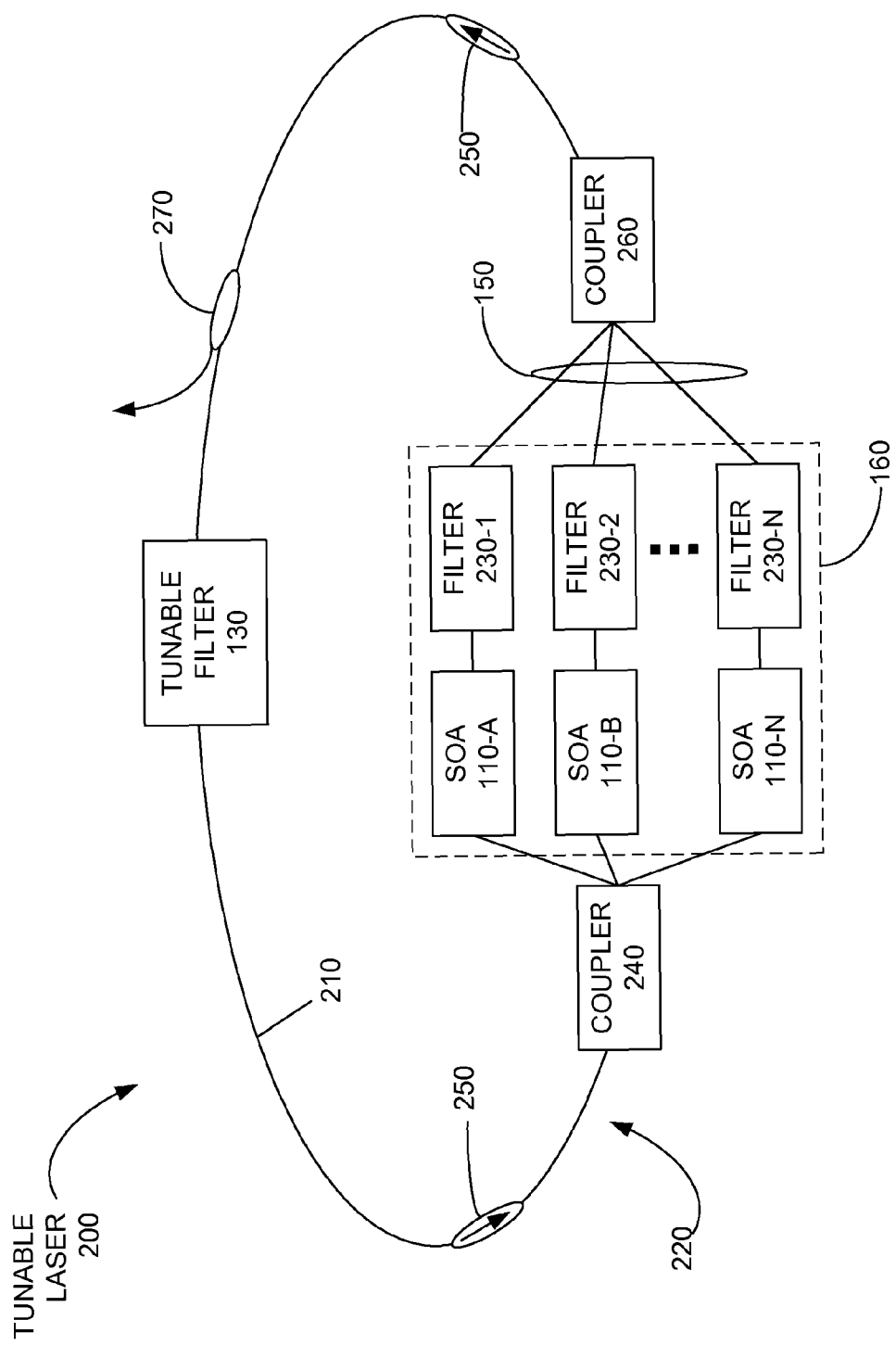
FIG. 2 is a block diagram showing further detail of one embodiment of the tunable laser of FIG. 1.

FIG. 2 is a block diagram showing further detail of one embodiment of a system and method for generating a tunable laser beam. Specifically, FIG. 2 illustrates a fiber ring cavity embodiment in which the optical components of a tunable laser 200 are coupled by a single mode fiber 210 arranged to form a ring 220. Single mode fiber 210 is designed to have a cut-off wavelength that is slightly shorter than the shortest operating wavelength of SOA array 160.

In the embodiment of FIG. 2, the output of each SOA 110 is provided to a corresponding optical filter 230. These filters 230 operate to shape the total emission spectrum to a desired shape. However, it is noted that an optical filter 230 positioned at the output of an SOA 110 is not required.

The multiple SOA coherent optical beams 150 generated by SOA array 160 are combined by a 1×N optical coupler 240, which also couples the combined beam to single mode fiber 210. One or more optical isolators 250 are arranged along fiber ring 220 to assure unidirectional lasing.

In operation, combined coherent light produced by SOA array 160 is coupled to fiber 210 and travels to tunable filter 130. After exiting tunable filter 130, but before re-entering SOA array 160, the combined beam is split by another 1×N optical coupler 260 (where N matches that of coupler 240), with each resulting beam being fed into a respective SOA 110. The individual optical beams are amplified again by the gain media and sent around ring 220 again. The tuned coherent optical beam exits ring 220 through an output coupler 270. In some embodiments, another set of SOAs (not shown) is used as an optical booster at the output port of coupler 270 to increase power. These additional SOAs can also be used to further shape the total emission spectrum of tunable laser 200.

Table 1 shows various commercially available SOAs which may be suitable for the tunable laser embodiments disclosed herein, along with their frequency range.

TABLE 1

| InPhenix IPSAD 1301-L | 830-870 nm |
|---|---|
| QPhotonics QSOA-915 | 885-935 nm |
| QPhotonics QSOA-980 | 950-995 nm |
| QPhotonics QSOA-1050 | 1010-1076 nm |
| Superium Diode SOA-382-850 | 830-870 nm |
| Superium Diode SOA-481 (double pass) | 940-990 nm |
| Superium Diode SOA-521 (double pass) | 985-1085 nm |
| Superium Diode SOA-522-1060 | 1035-1085 nm |
| Covega Booster Opamp 1132 | 1265-1335 nm |
| Covega Booster Opamp 1017 | 1280-1340 nm |
| Covega Booster Opamp 1036 | 1315-1385 nm |

Figure 3:
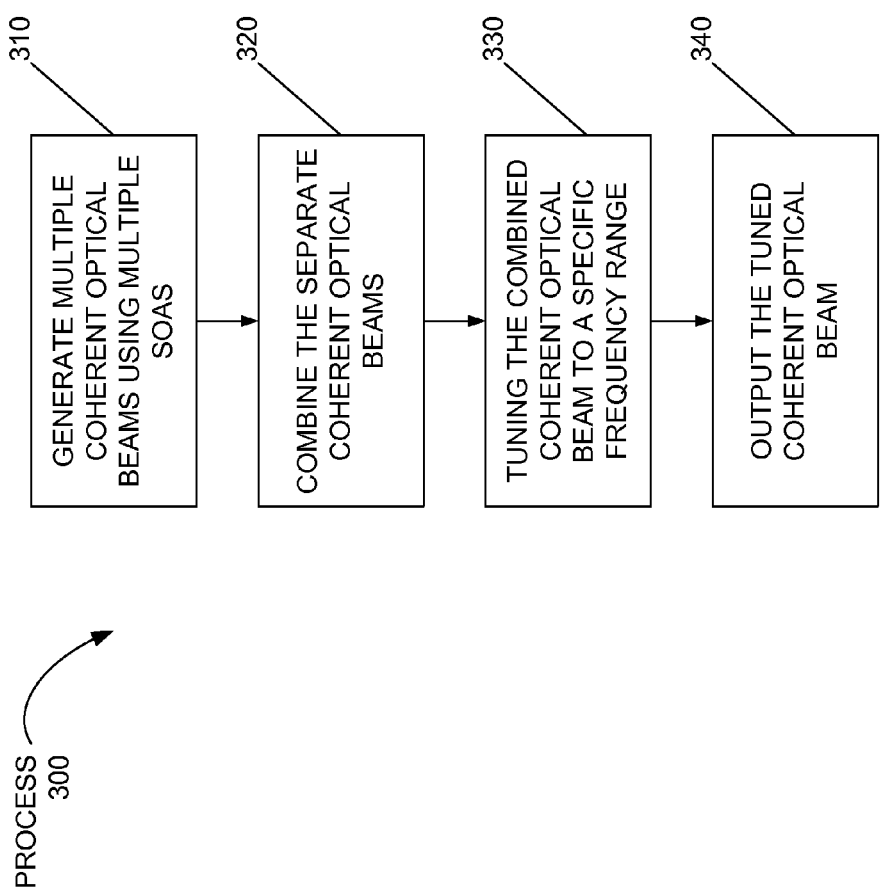
FIG. 3 is a flowchart of a method for generating a tuned optical beam in a laser, according to some embodiments disclosed herein.

FIG. 3 is a flowchart of a method for generating a tuned optical beam in a laser. Process 300 begins at block 310, where multiple coherent optical beams are generated by respective SOAs, each having a different center frequency, and having overlapping bandwidth between neighbors. At block 320, the individual coherent optical beams are combined with an optical combiner or coupler. At block 330 the combined coherent optical beam is tuned to a selected frequency range. Finally, at block 340 the combined coherent optical beam at the selected frequency range is output from the laser.

Figure 4:
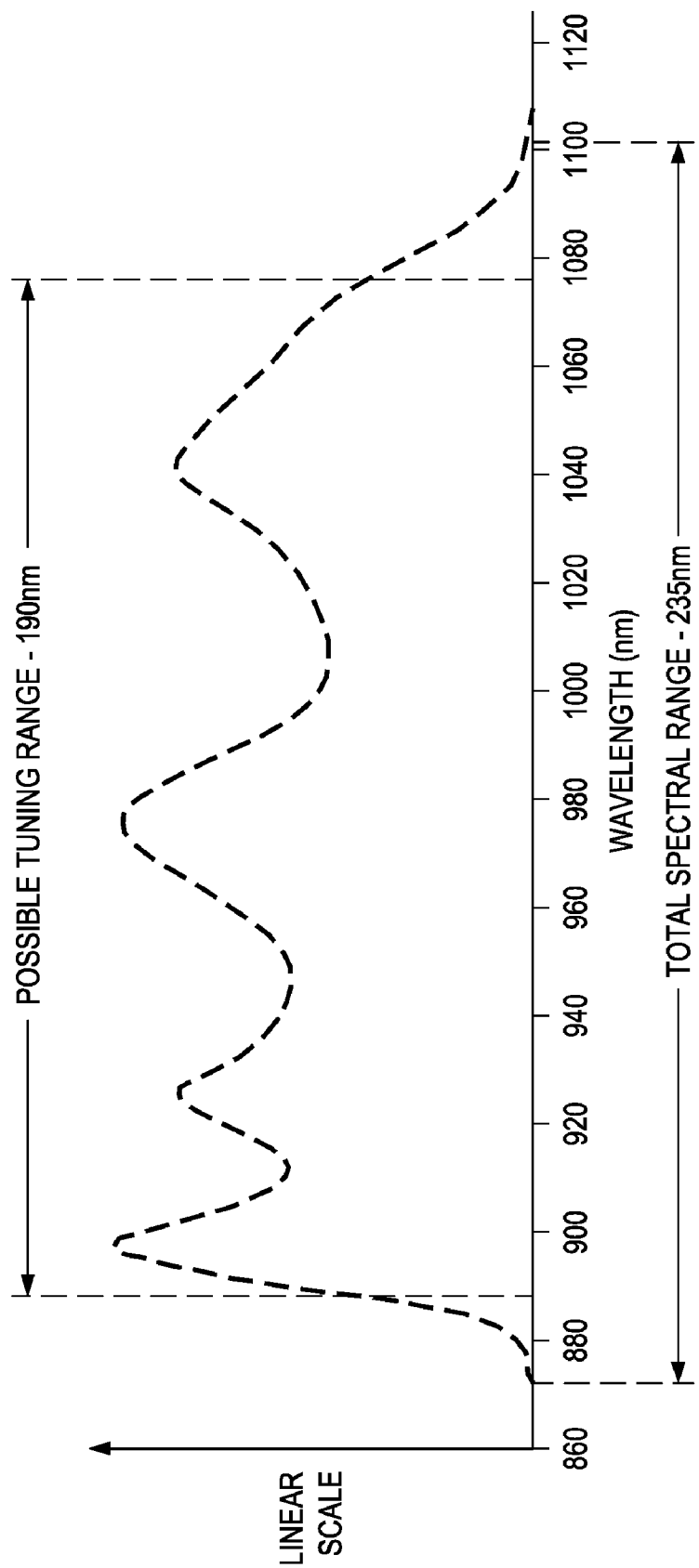
FIG. 4 is a graph of the emission spectrum of one embodiment of the tunable laser from FIG. 2, showing power output at various wavelengths.
Figure 5:
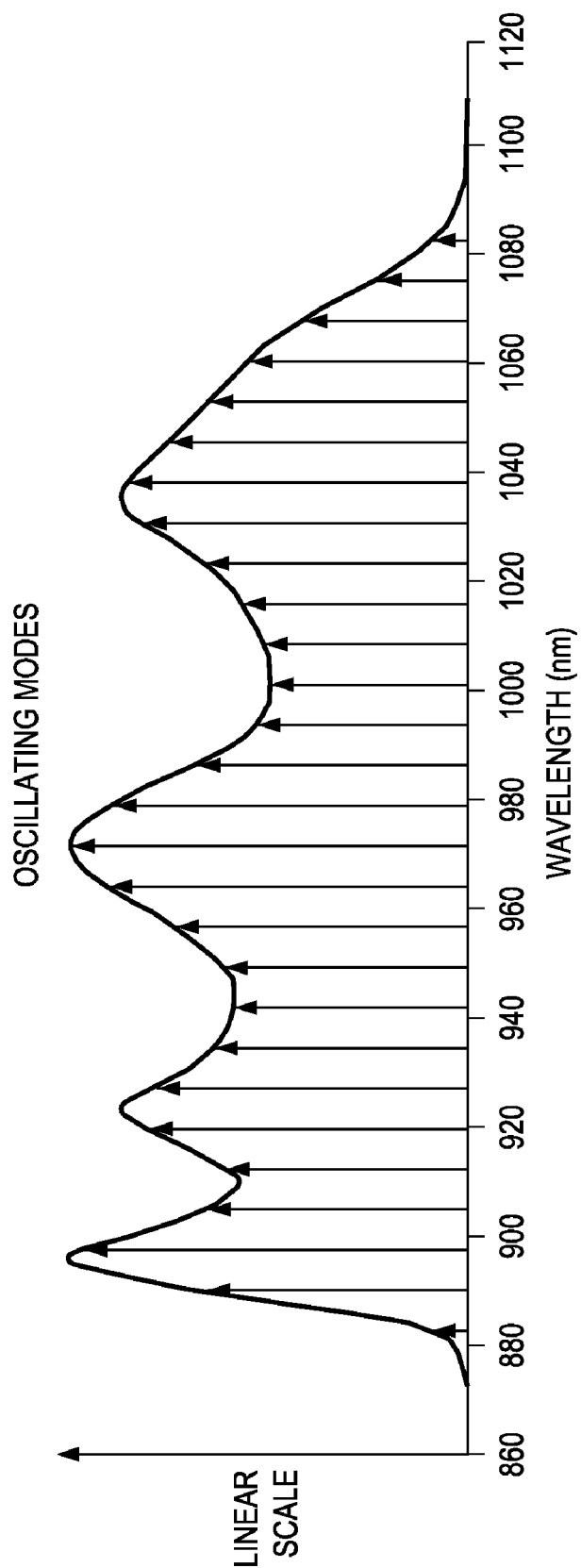
FIG. 5 is a graph of the oscillating modes produced by one embodiment of the tunable laser from FIG. 2, showing power output at various wavelengths.
Figure 6:
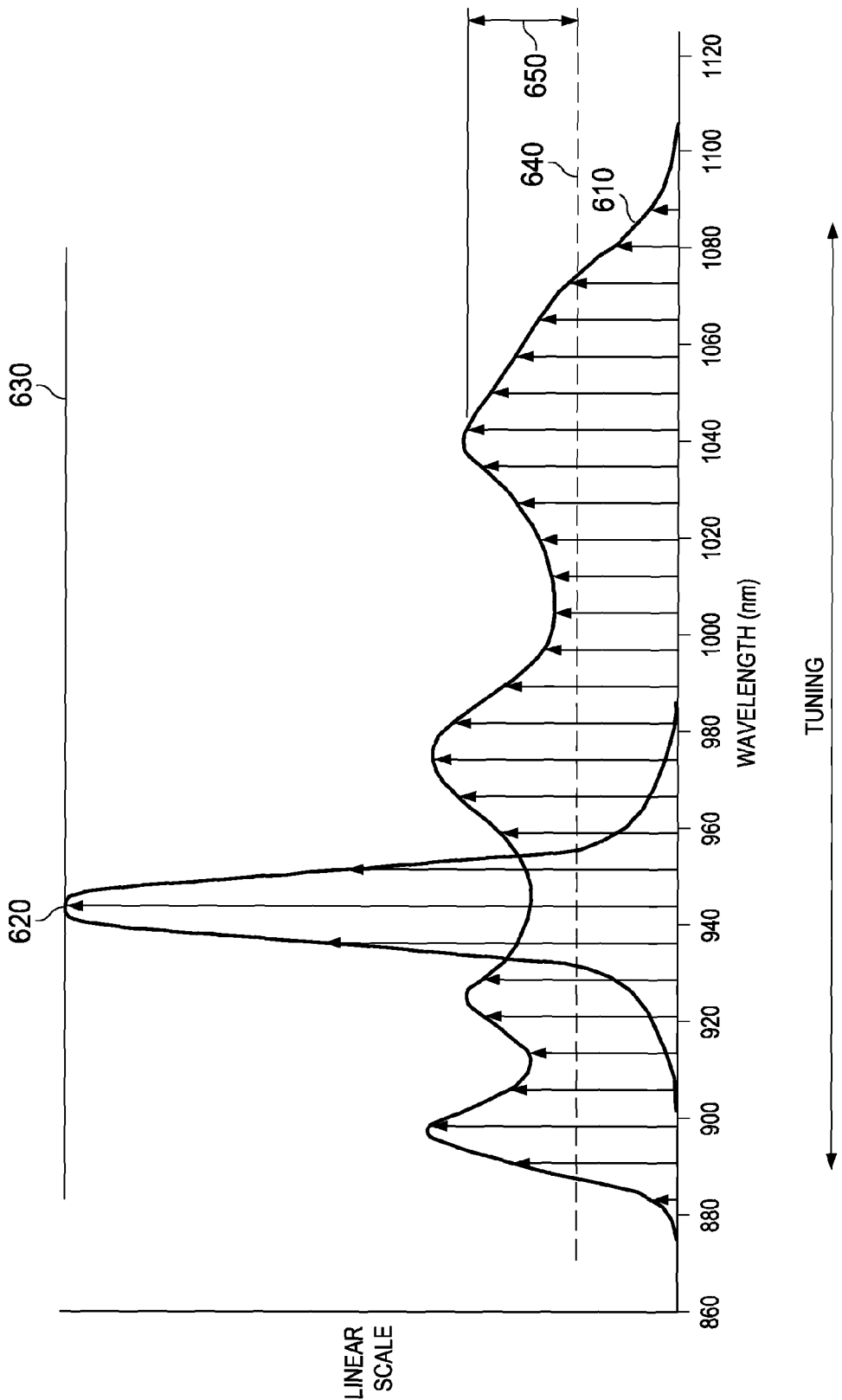
FIG. 6 is a graph of the amplified emission spectrum of one embodiment of the tunable laser from FIG. 2, showing power output at various wavelengths.

FIGS. 4-6 are graphs showing various performance characteristics of one embodiment of tunable laser 200. The embodiment of FIGS. 4-6 uses three SOAs: a first with wavelength 885-935 nm; a second with wavelength 950-995 nm; and a third with wavelength 1010-1080 nm. The single mode fiber has a cut-off wavelength of approximately 860 nm.

FIG. 4 is a graph of the emission spectrum of this embodiment of tunable laser 200, showing power output at various wavelengths. This embodiment provides a center wavelength of 985 nm, a total spectral range of approximately 235 nm, and a tuning range of approximately 190 nm, centered at approximately 1 μm (measured at 50% peak intensity, i.e., full width at half maximum or FWHM). In optical coherence tomography (OCT) applications, the axial point spread function, and thus axial resolution, is determined by the spectral shape and spectral bandwidth, respectively. With the improved spectral bandwidth shown in FIG. 4, this embodiment of tunable laser 200 provides less than 2.5 μm of axial resolution. This resolution can be improved even further by increasing the number of SOAs in the array.

FIG. 5 is a graph of the oscillating modes produced by the same embodiment of tunable laser 200, showing power output at various wavelengths. Spacing between modes is $1/t_{round}$, with $t_{round}$ given by $$t_{round} = \frac{L \cdot n_{fiber}}{c}.$$

FIG. 6 is a graph of the amplified emission spectrum of the same embodiment of tunable laser 200, showing power output at various wavelengths. Curve 610 is the overall amplified output spectrum $P_{ASE}$ and curve 620 is the filtering window. Horizontal line 630 is the saturation power $P_{sat}$, which is assumed to be constant across the wavelengths. Horizontal line 640 is the total power loss within the resonant cavity. Line 650 thus represents the net gain per roundtrip β. The number of roundtrips to reach saturation (n) can then be calculated as:

$$n = \frac{\log\left(\frac{P_{sat}}{P_{ASE}}\right)}{\log(\beta)}$$

The foregoing disclosure has been presented for purposes of illustration and description. The disclosure is not intended to be exhaustive or to limit the disclosure to the precise forms disclosed. Various modifications or variations are possible in light of the above teachings. The implementations discussed, however, were chosen and described to illustrate the principles of the disclosure and its practical application to thereby enable one of ordinary skill in the art to utilize the disclosure in various implementations and with various modifications as are suited to the particular use contemplated. All such modifications and variations are within the scope of the disclosure as determined by the appended claims when interpreted in accordance with the breadth to which they are fairly and legally entitled.

The invention claimed is:

1. A method of generating a tuned laser beam, the method comprising: generating each of a plurality of coherent optical beams from respective semiconductor optical amplifiers (SOAs) arranged in parallel within a resonant cavity, each of the coherent optical beams having a different center wavelength and overlapping in bandwidth with another one of the coherent optical beams; combining the plurality of coherent optical beams into a combined coherent optical beam; and tuning the combined beam to a selected frequency range to output a coherent optical beam having only the selected frequency range; wherein the output coherent optical beam has a tuning range of approximately 190 nm that is centered at approximately 1 um; wherein tuning comprises tuning using a Fabry-Perot tunable filter; wherein tuning comprises tuning using a polygon mirror scanner.

2. The method of claim 1, further comprising optically filtering at least one of the coherent optical beams before the combining.

3. The method of claim 1, wherein the combining comprises optically coupling the plurality of coherent optical beams.

4. A tunable laser comprising: a resonant cavity; a plurality of semiconductor optical amplifiers (SOAs) arranged in parallel within the resonant cavity, each configured to produce a respective coherent optical beam, each coherent optical beam having a different center wavelength that overlaps in bandwidth with another one of the coherent optical beams; an optical combiner configured to receive the plurality of coherent optical beams and to combine the coherent optical beams into a combined coherent optical beam; and a tunable filter configured to receive the combined coherent optical beam and to output a filtered coherent optical beam having a selected range of wavelengths; wherein the filtered coherent optical beam has a tuning range of approximately 190 nm that is centered at approximately 1 um; wherein the resonant cavity has a linear configuration; wherein the tunable filter comprises a Fabry-Perot tunable filter.

5. The tunable laser of claim 4, wherein the tunable filter comprises a polygon mirror scanner.

6. The tunable laser of claim 4, further comprising:
a plurality of optical filters, each optical filter coupled to an output of a respective SOA.

7. A tunable laser comprising: a resonant cavity; a single mode fiber arranged in a ring within the resonant cavity; a plurality of semiconductor optical amplifiers (SOAs) arranged in parallel within the resonant cavity, each configured to produce a respective coherent optical beam, each coherent optical beam having a different center wavelength that overlaps in bandwidth with another one of the coherent optical beams; an optical coupler configured to receive the coherent optical beams, to combine the coherent optical beams into a combined coherent optical beam, and to couple the combined coherent optical beam onto the single mode fiber; and a tunable filter coupled to the single mode fiber and configured to receive the combined coherent optical beam and to output onto the single mode fiber a coherent optical beam having a selected range of wavelengths; further comprising: a plurality of optical filters, each optical filter coupled to an output of a respective SOA; wherein the tunable filter comprises a Fabry-Perot tunable filter; wherein the tunable filter comprises a polygon mirror scanner.

8. The tunable laser of claim 7, further comprising:
an optical isolator connected to the single mode fiber.

9. The tunable laser of claim 7, further comprising:
an output coupler connected to the single mode fiber.

10. The tunable laser of claim 7, further comprising:
an output coupler connected to the single mode fiber and having an output port; and
an optical booster coupled to the output port.

11. The tunable laser of claim 7, further comprising:
an output coupler connected to the single mode fiber and having an output port; and
an additional plurality of SOAs coupled to the output port.

* * * * *